United States Patent
Akashi

[11] Patent Number: 6,028,991
[45] Date of Patent: Feb. 22, 2000

[54] LAYOUT PARAMETER EXTRACTION DEVICE

[75] Inventor: Teruo Akashi, Osaka, Japan

[73] Assignee: Matsushita Electric Industrial Co., Ltd., Osaka, Japan

[21] Appl. No.: 08/833,964

[22] Filed: Apr. 11, 1997

[51] Int. Cl.[7] .................................................. H05K 7/02
[52] U.S. Cl. ................................ 395/500.15; 395/500.19
[58] Field of Search ......................................... 395/500.15

[56] References Cited

U.S. PATENT DOCUMENTS 5,572,436  11/1996  Dangelo .................................. 364/489
5,631,841   5/1997  Kishida .................................. 364/488

*Primary Examiner*—Kevin J. Teska
*Assistant Examiner*—Thuan Do
*Attorney, Agent, or Firm*—McDermott, Will & Emery

[57] ABSTRACT

Circuit connection information extracting means reads circuit information. The circuit information has a hierarchical structure having an upper hierarchy including a plurality of instance cells and an interconnect for connecting the instance cells, and a lower hierarchy acting as connection information (internal nets) in the instance cells. When extracting a partial circuit, only nets belonging to the upper hierarchy are specified as net selection information. Instance cell extracting means inputs the net selection information, decides whether or not all the nets connected to the instance cells are specified by the net selection information, and extracts any instance cells in which all the nets are specified. Net name generating means recognizes the internal nets for each extracted instance cell, attaches net names capable of uniquely identifying nodes to the internal nets, and stores the net names as additional net information. Selective circuit extracting means extracts a partial circuit to which the nets belong on the basis of the net selection information and the additional net information. Accordingly, necessary sets of nets can automatically be obtained to easily select a partial circuit to be simulated only by specifying a small number of nets.

4 Claims, 13 Drawing Sheets

LAYOUT PARAMETER EXTRACTION DEVICE

BACKGROUND OF THE INVENTION

The present invention relates to improvement of a layout parameter extraction device for specifying and extracting a part of a circuit including parasitic elements such as a resistance and a capacity of an interconnect which are extracted from layout data when outputting the same circuit as a netlist in design of a semiconductor circuit.

In recent years, it has been important to recognize an interconnect from layout data, to extract parasitic elements such as a resistance and a capacity of the interconnect, to estimate values with high precision, and to simulate a delay time of a signal or the like in a circuit obtained from the layout data with high precision in a finer semiconductor process.

Procedure for obtaining a circuit including parasitic elements from layout data will be described below. First of all, an interconnect or an element such as a MOS transistor is recognized from the layout data to extract circuit information. In order to extract a parasitic resistance for each interconnect, then, the interconnect is divided in accordance with a shape of a circuit such as branch points or lengths, and nodes are generated on dividing points and node names are respectively assigned to the generated nodes. Thereafter, the parasitic elements such as a resistance and a capacity are extracted according to a predetermined interconnect model for each divided interconnect, and each terminal of the parasitic elements is connected to a proper node. Subsequently, a whole circuit is restructured to output a netlist of the circuit including the parasitic elements.

In the prior art, however, the case where a part of the circuit including the parasitic elements is specified to simulate the partial circuit has the following problems. Respective names are attached to identify each node generated on the dividing points of the interconnect and the like. In the name attachment, a layout parameter extraction device assigns the node names not so appropriately. For this reason, even if the node names are included in the netlist, it is difficult to recognize respective positions of the nodes in the circuit before extracting the parasitic elements. Accordingly, when simulating the partial circuit, it is hard to recognize, on the netlist, probing points for specifying the partial circuit.

In the case where the layout data has a hierarchical structure including an upper hierarchy and a lower hierarchy, it is impossible to recognize the names of the nodes generated on connecting points between the upper hierarchy and the lower hierarchy even if only the upper hierarchy should be extracted in order to shorten a time for extracting the parasitic elements. Similarly to the foregoing, when simulating the partial circuit, it is hard to recognize necessary probing points on the netlist.

Furthermore, the parasitic elements are extracted from a part of a large scale circuit. In the case where layout data of the large scale circuit has the hierarchical structure including an upper hierarchy and a lower hierarchy, it is necessary to specify nets belonging to the lower hierarchy as well as nets belonging to the upper hierarchy if the upper hierarchy and the lower hierarchy included in the partial circuit are to be extracted when restricting the partial circuit from which the parasitic elements are to be extracted. A lot of internal nets for coupling a plurality of transistors belong to the lower hierarchy in a cell having predetermined functions of, for example, an AND gate or the like. It is difficult to specify all the internal nets, and it takes a long time to do the same.

SUMMARY OF THE INVENTION

It is a first object of the present invention to attach names capable of uniquely recognizing nodes to be probing points when simulating a partial circuit, and to cause a netlist of the circuit having parasitic elements to include the node names, thereby easily recognizing the probing points on the netlist.

It is a second object of the present invention to automatically supplement a set of internal nets of a lower hierarchy necessary for restricting the partial circuit only by specifying nets of an upper hierarchy when extracting parasitic elements from the restricted partial circuit, thereby simplifying specification of nets necessary for restricting the partial circuit.

In order to achieve the first object of the present invention, node generation information including coordinates of nodes and names capable of uniquely identifying the nodes are given in advance so as to generate the nodes in positions to be the probing points. Furthermore, in the case where layout data has a hierarchical structure including an upper hierarchy and a lower hierarchy, the names capable of uniquely identifying nodes can be added to the nodes generated on connecting points between the upper hierarchy and the lower hierarchy when extracting only the upper hierarchy.

In order to achieve the second object of the present invention, in the case where the layout data has the hierarchical structure including the upper hierarchy and the lower hierarchy, the upper hierarchy and the lower hierarchy are first recognized, and the lower hierarchy interposed between nets of the upper hierarchy is recognized if the nets belonging to the upper hierarchy are specified, thereby automatically specifying internal nets belonging to the lower hierarchy.

The present invention provides a first layout parameter extraction device, comprising: layout data reading means for reading layout data; node generation information adding means for inputting node generation information including coordinates of nodes to be generated and node names capable of uniquely identifying the nodes, and for adding information for node generation to the layout data on the basis of the node generation information; circuit recognizing means, which receives the layout data to which the information for node generation is added, for recognizing a circuit represented by the layout data and storing a result of recognition as circuit information; node generating means, which receive the circuit information, for generating nodes on predetermined points of the circuit indicated by the circuit information on the basis of a shape of the circuit and generating nodes respectively on the coordinates on the basis of the information for node generation included in the received circuit information, for assigning node names capable of uniquely identifying nodes as names of the nodes generated on the coordinates, respectively, and for storing the nodes as node information; parasitic element extracting means for extracting parasitic elements from the layout data, connecting the extracted parasitic elements to the nodes on the basis of the node information, and for storing them as parasitic element information; and circuit output means for forming a circuit from the circuit information and the parasitic element information, and outputting a netlist of a result of formation.

The present invention provides a second layout parameter extraction device, comprising: layout data reading means for reading layout data having a hierarchical structure including an upper hierarchy and a lower hierarchy; upper hierarchy recognizing means for recognizing connecting points between the upper hierarchy and the lower hierarchy of the layout data, and for storing, as upper hierarchical data, the layout data of the upper hierarchy and placement information of the lower hierarchy; circuit recognizing means for recognizing a circuit represented by the upper hierarchical data, and for storing the circuit as circuit information; node generating means, which receives the circuit information, for generating nodes respectively on predetermined points of the circuit indicated by the circuit information on the basis of a shape of the circuit and generating nodes respectively on the connecting points between the upper hierarchy and the lower hierarchy recognized by the upper hierarchy recognizing means, and for storing the nodes as node information; node name assigning means for assigning node names capable of uniquely recognizing nodes to the nodes generated on the connecting points between the upper hierarchy and the lower hierarchy, and for adding the node names to the node information; parasitic element extracting means for extracting parasitic elements from the upper hierarchical data, for connecting the extracted parasitic elements to the nodes on the basis of the node information, and for storing them as parasitic element information; and circuit output means for forming a circuit from the circuit information and the parasitic element information, and for outputting a netlist of a result of formation.

The present invention provides a third layout parameter extraction device, comprising: layout data reading means for reading layout data having a hierarchical structure including an upper hierarchy and a lower hierarchy; hierarchy recognizing means, which receives the layout data from the layout data reading means, for recognizing connecting points between the upper hierarchy and the lower hierarchy on the layout data, and for storing the connecting points as node generation information; circuit recognizing means, which receives the layout data from the layout data reading means, for recognizing a circuit represented by the layout data, and for storing a result of recognition as circuit information; node generating means, which receive the circuit information and the node generation information, for generating nodes respectively on predetermined points of the circuit indicated by the circuit information on the basis of a shape of the circuit and generating nodes respectively on the connecting points between the upper hierarchy and the lower hierarchy acting as the node generation information, and for storing the nodes as node information; node name assigning means for assigning node names to the nodes respectively generated on the connecting points between the upper hierarchy and the lower hierarchy so as to be uniquely recognized, and for adding the node names to the node information; parasitic element extracting means for extracting parasitic elements from the layout data, for connecting the extracted parasitic elements to the nodes on the basis of the node information, and for storing them as parasitic element information; and circuit output means for forming a circuit from the circuit information and the parasitic element information, and for outputting a netlist of a result of formation.

The present invention provides a fourth layout parameter extraction device, comprising: circuit connection information extracting means for inputting circuit information having a hierarchical structure including an upper hierarchy and a lower hierarchy, for recognizing connection state of a circuit from the circuit information, for extracting circuit connection information of a plurality of instance cells included in the upper hierarchy and interconnects between the instance cells, and for extracting internal nets as the lower hierarchy in each of the instance cells, and storing the internal nets as cell information; instance cell extracting means, which receives net selection information including nets of the upper hierarchy which are selected in advance, for extracting an instance cell necessary for circuit extraction from the circuit connection information on the basis of the net selection information; net name generating means for recognizing the internal nets in the instance cell extracted by the instance cell extracting means, for converting names of the recognized internal nets into net names capable of uniquely identifying nodes, and for storing the net names as additional net information; and selective circuit extracting means for adding the additional net information to the net selection information, for selecting a partial circuit including the nets, and for extracting parasitic elements for the partial circuit.

According to the first invention, by preparing, as the node generation information, the positions (nodes) on a circuit to be specified as probing points and the node names capable of uniquely identifying the nodes, the same nodes are included in the netlist so as to be uniquely identified. Consequently, it is possible to easily specify the probing points during simulation.

According to the second and third inventions, in the case where the layout data has the hierarchical structure, the node names capable of uniquely identifying the nodes are attached to respective connecting points between the upper hierarchy and the lower hierarchy and the node names are included in the netlist. Therefore, if the node names in the netlist are specified, the circuits between the cells included in the connecting points can be simulated by using the connecting points as the probing points.

According to the fourth invention, if the net of the upper hierarchy is selected, the necessary internal nets of the lower hierarchy are supplemented. Therefore, the number of nets to be selected can be decreased and the nets can easily be selected during simulation. In addition, net selection has less errors. In particular, in the case where a lot of instance cells exist in the lower hierarchy, the number of steps can greatly be reduced when selecting a part of a large scale circuit.

BRIEF DESCRIPTION OF THE DRAWINGS

The accompanying drawings show preferred embodiments of the present invention, in which.

DETAILED DESCRIPTION OF THE INVENTION

Preferred embodiments of the present invention will be described below with reference to the drawings.

(First Embodiment)

Figure 1:
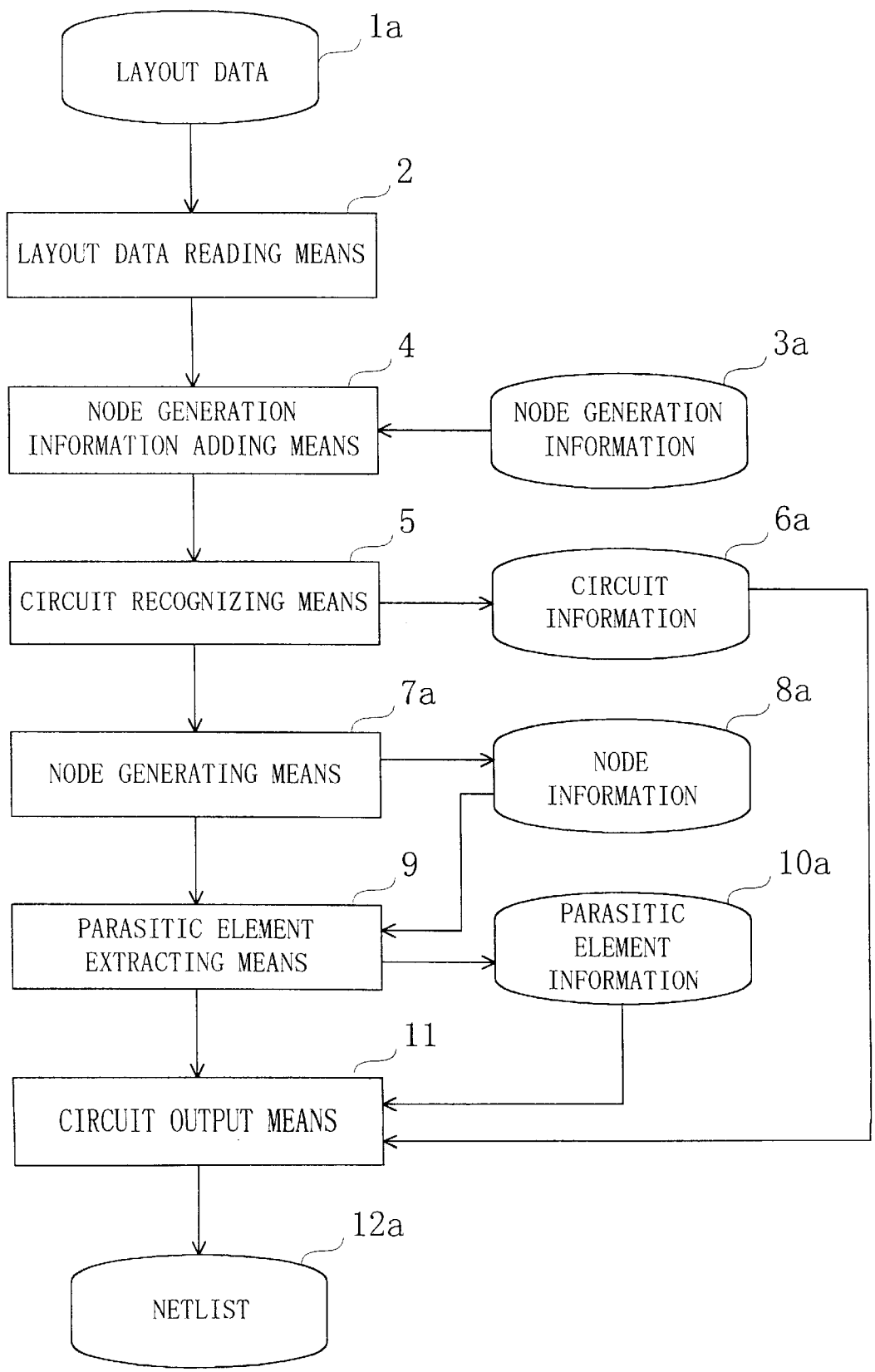
FIG. 1 is a block diagram showing a structure of a layout parameter extraction device according to a first embodiment of the present invention.
Figure 2:
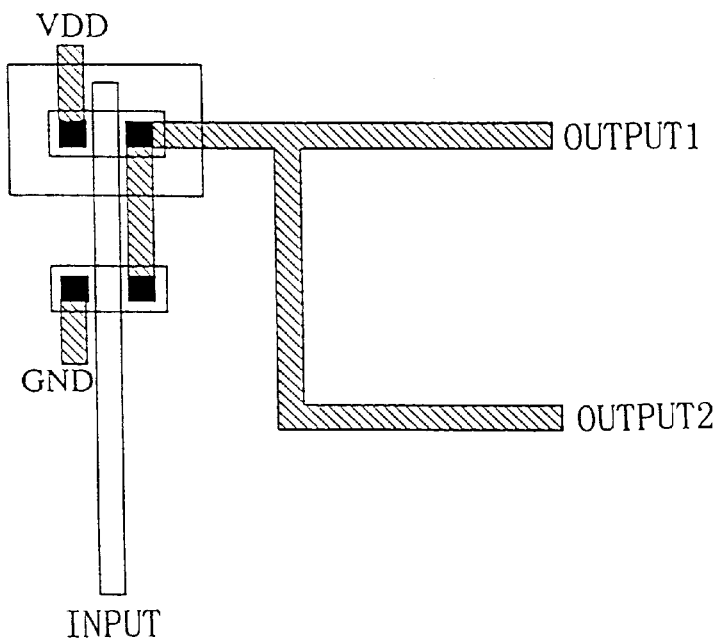
FIG. 2 is a diagram showing an example of layout data to be used for the layout parameter extraction device.

FIG. 1 shows a flow of a processing of a layout parameter extraction device according to a first embodiment of the present invention. In FIG. 1, the reference numeral 1a denotes layout data representing a semiconductor circuit. For example, the layout data 1a represents a circuit shown in FIG. 2, and includes "VDD" indicative of a power supply having a predetermined voltage, "GND" indicative of a ground supply, and "output 1" and "output 2" indicative of two output terminals. The reference numeral 2 denotes layout data reading means for reading the layout data 1a.

Figure 3:
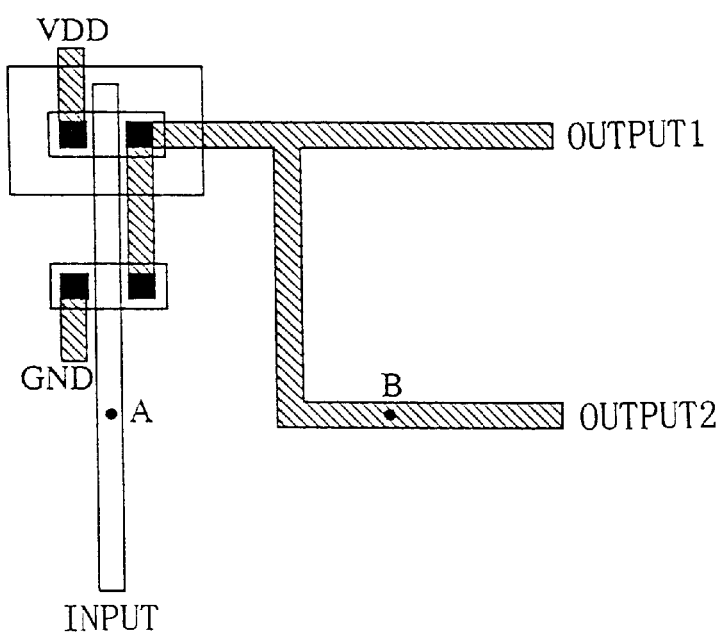
FIG. 3 is a diagram showing layout data to which nodes based on node generation information are added.

The reference numeral 3a denotes node generation information including coordinates of generation positions of nodes to be probing points necessary for simulation, and node names for uniquely identifying the nodes. The node generation information 3a indicates, for the layout data shown in FIG. 1, that a node name "A" is generated in a position in the vicinity of "input 1" and a node name "B" is generated in a position in the vicinity of "output 2" as shown in FIG. 3, for example. The node generation information 3a is given in advance by a simulator or the like if necessary. The generation positions of the nodes to be the probing points are not restricted but specified by an optional positions on interconnects.

The reference numeral 4 denotes node generation information adding means for reading the node generation information 3a and adding the node generation information 3a to the layout data 1a. FIG. 3 shows layout data to which the node generation information 3a of the node name A and the node name B are added.

Figure 4:
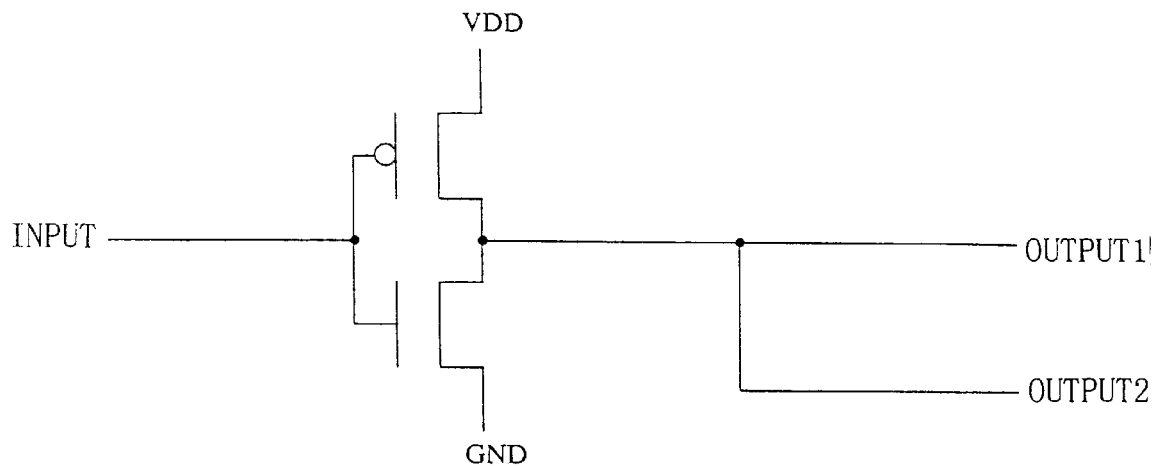
FIG. 4 is a diagram showing a circuit equivalent to circuit information obtained by the layout parameter extraction device.

The reference numeral 5 denotes circuit recognizing means for recognizing and extracting a source, a drain and a gate of each transistor, an interconnect, a well, a contact and the like from the layout data to which the node generation information 3a is added, thereby recognizing the circuit, and for storing, as circuit information 6a, the recognized transistor information and interconnect information between a plurality of transistors. FIG. 4 is a diagram showing a circuit equivalent to the circuit information 6a.

The reference numeral 7a denotes node generating means for performing the following operation. First of all, the interconnect recognized by the circuit recognizing means 5 is divided into a plurality of portions. For example, the division causes interconnect graphics to be divided by interconnecting branch points or the like to generate segments. The segments obtained by the division are split in every predetermined length if they exceed a predetermined length. Then, dividing points and split points of the interconnect are set to nodes. Node names are assigned respectively to the nodes so that nodes are generated. The nodes are generated also in positions added by the node generation information adding means 4. The node names according to the node generation information 3a are assigned to the nodes. The reference numeral 8a denotes node information generated by the node generating means 7a. The node information 8a includes nodes (dividing and split points) indicated at N1, N2, N3, N4, N5 and N6 in FIG. 5, and nodes A and B obtained from the node generation information 3a, for example.

The reference numeral 9 denotes parasitic element extracting means for extracting a parasitic resistance and a parasitic capacity as parasitic elements for each divided or split interconnect, and for connecting terminals of each parasitic element to proper nodes on the basis of the node information 8a, to be stored as parasitic element information 10a.

Figure 5:
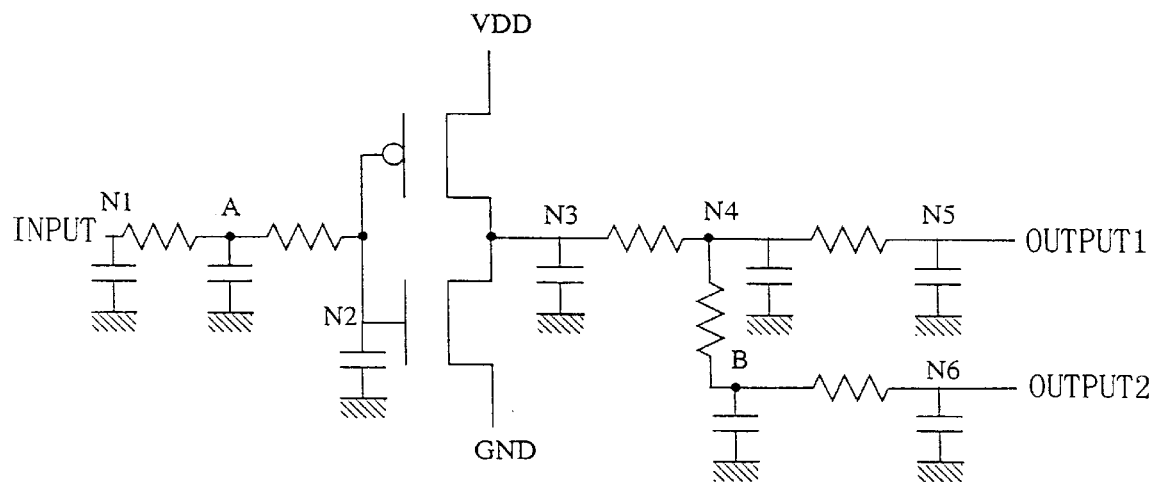
FIG. 5 is a diagram showing a circuit equivalent to a netlist obtained by the layout parameter extraction device.

The reference numeral 11 denotes circuit output means for synthesizing the parasitic element information 10a and the circuit information 6a to form a circuit and for outputting a result of formation as a netlist. The reference numeral 12a denotes a netlist output from the circuit output means 11. FIG. 5 is a diagram showing a circuit equivalent to the output netlist 12a.

In the present embodiment, accordingly, if the coordinates (node positions) on the circuit to be the probing points and the node names thereof are specified as the node generation information 3a during simulation, the specified node names A and B are included in the netlist 12a output from the circuit output means 11 as illustrated in FIG. 5. Consequently, a partial circuit formed between the nodes A and B in the netlist 12a can easily be simulated by using the nodes A and B as probing points if they are specified during the simulation. Accordingly, if coordinates (node positions) of both ends (probing points) of the partial circuit to be simulated and the node names thereof are stored as the node generation information 3a in advance, the partial circuit to be simulated can easily be simulated only by specifying the node names in the netlist 12a.

(Second Embodiment)

Figure 6:
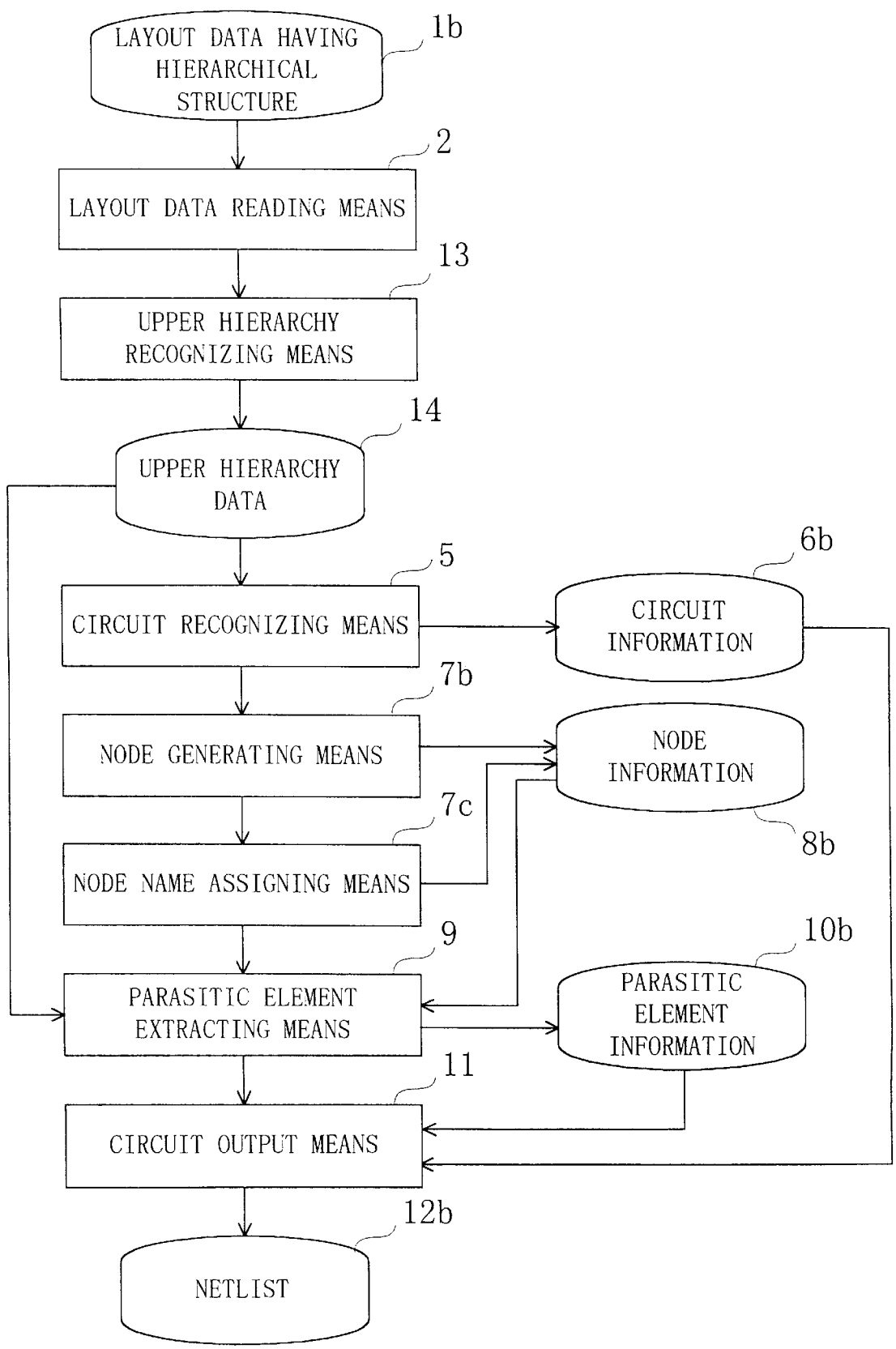
FIG. 6 is a block diagram showing a structure of a layout parameter extraction device according to a second embodiment of the present invention.

FIG. 6 shows a flow of a processing of a layout parameter extraction device according to a second embodiment of the present invention.

Figure 7:
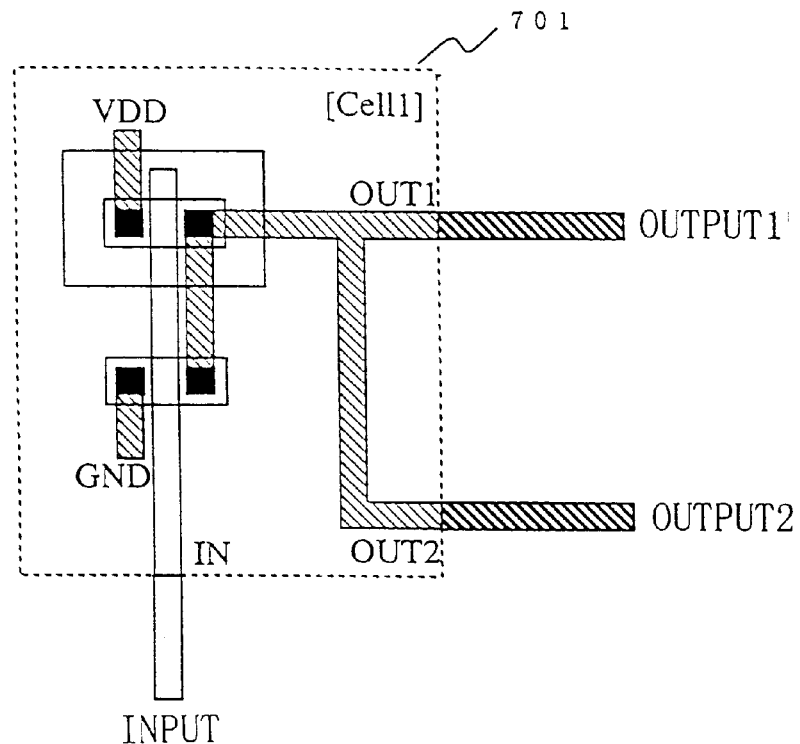
FIG. 7 is a diagram showing an example of layout data to be used for the layout parameter extraction device.

In FIG. 6, the reference numeral 1b denotes layout data having a hierarchical structure as shown in FIG. 7, for example. In FIG. 7, a broken line indicated at 701 denotes an outer frame of a cell which exists on a lower hierarchy. The outside of the outer frame 701 of the cell represents a circuit of an upper hierarchy, and the inside of the outer frame 701 of the cell represents a circuit of a lower hierarchy. "Cell1" denotes an instance name, and "VDD" and "GND" denote pin names of the cell. Furthermore, "IN", "OUT1" and "OUT2" denote input and output pin names of the cell, and indicate connecting points between the upper hierarchy and the lower hierarchy.

In FIG. 6, the reference numeral 2 denotes layout data reading means for reading the layout data 1b. The reference numeral 13 denotes upper hierarchy recognizing means for recognizing layout data included in the upper hierarchy and for recognizing, as placement information of the lower hierarchy, the outer frame 701 of the lower hierarchy and the connecting points "IN", "OUT1" and "OUT2" between the upper hierarchy and the lower hierarchy, and for storing them as upper hierarchical data. The reference numeral 14 denotes the upper hierarchical data recognized by the upper hierarchy recognizing means 13.

Figure 8:
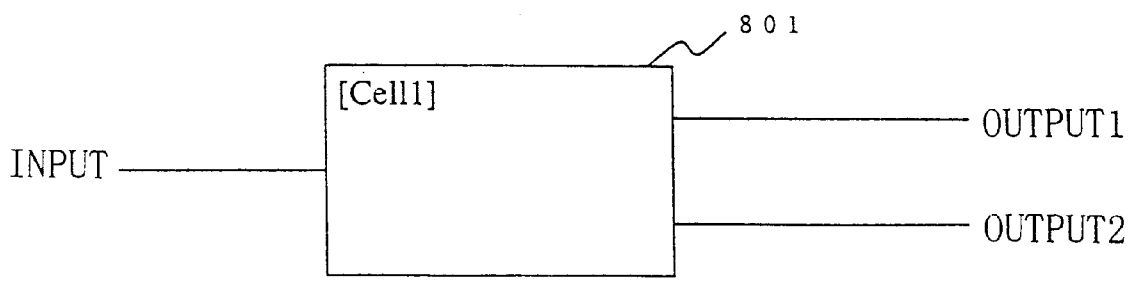
FIG. 8 is a diagram showing a circuit equivalent to circuit information obtained by the layout parameter extraction device.

The reference numeral 5 denotes circuit recognizing means for recognizing connection information of a circuit from the upper hierarchical data 14. The reference numeral 6b denotes circuit information recognized by the circuit recognizing means 5. FIG. 8 is a diagram showing a circuit equivalent to the circuit information 6b. In FIG. 8, the reference numeral 801 denotes cell information capable of uniquely identifying the outer frame (lower hierarchy) 701 of the cell in FIG. 7.

The reference numeral 7b denotes node generating means for dividing and splitting interconnects included in the circuit recognized by the circuit recognizing means 5 into a plurality of portions in the same manner as in the first embodiment, for setting dividing and splitting points to nodes, and for assigning node names to generate nodes. "N1", "N2" and "N3" shown in FIG. 9 denote the node names thus assigned. Furthermore, the node generating means 7b serves to generate nodes on connecting points "IN", "OUT1" and "OUT2" between the upper hierarchy and the lower hierarchy. The reference numeral 8b denotes node information generated by the node generating means 7b.

Figure 9:
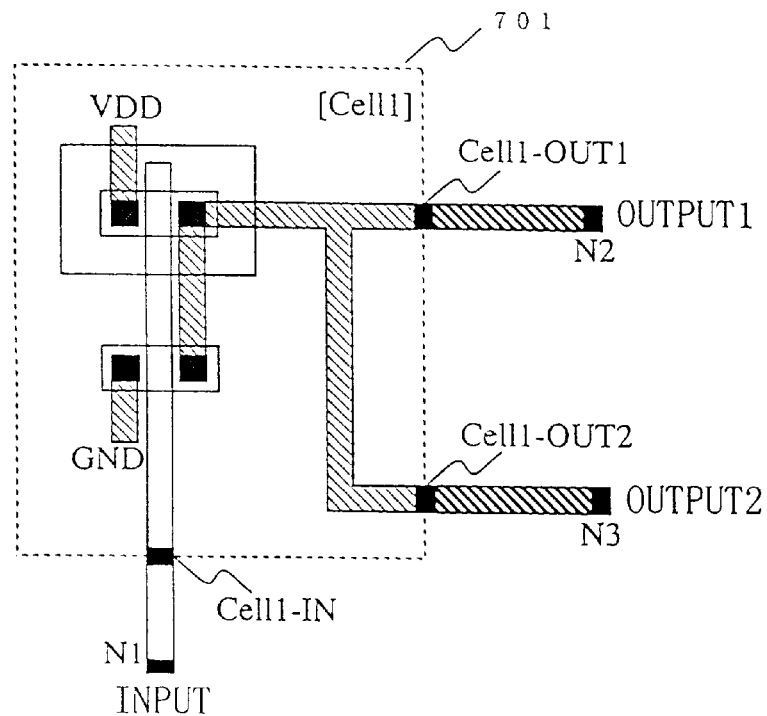
FIG. 9 is a diagram showing layout data to which nodes based on node information are added.
Figure 10:
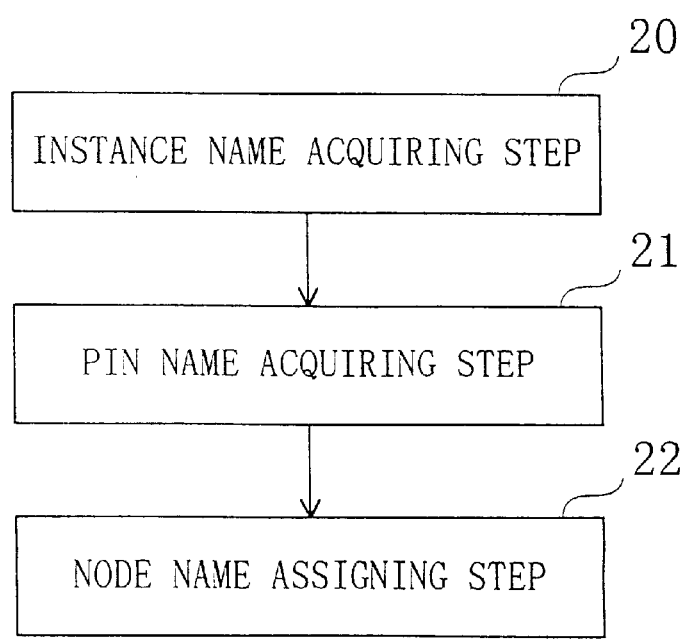
FIG. 10 is a flow chart showing a processing of assigning node names by node name assigning means.

The reference numeral 7c denotes node name assigning means for assigning node names to the nodes generated on the connecting pints "IN", "OUT1" and "OUT2" between the upper hierarchy and the lower hierarchy by the node generating means 7b. This assignment is performed in such a manner that each connecting point can uniquely be identified according to a processing shown in FIG. 10. In FIG. 10, the reference numeral 20 denotes an instance name acquiring step where an instance name "Cell1" of the cell is acquired. The reference numeral 21 denotes a pin name acquiring step where an input pin name "IN" and output pin names "OUT1" and "OUT2" of the cell are acquired. The reference numeral 22 denotes a node name assigning step where node names "Cell1-IN", "Cell1-OUT1" and "Cell1-OUT2" obtained by combining the input pin name "IN" and the output pin names "OUT1" and "OUT2" with the acquired instance name "Cell1" are assigned as node names of the connecting points "IN", "OUT1" and "OUT2", respectively. The node names capable of uniquely identifying the nodes are added to the node information 8b. FIG. 9 shows layout data including the nodes generated by the node generating means 7b and the node names assigned by the node name assigning means 7c.

The reference numeral 9 denotes the same parasitic element extracting means as in the first embodiment. The parasitic element extracting means 9 serves to extract a parasitic resistance and a parasitic capacity as parasitic elements for each interconnect divided or split by the node generating means 7b, to connect a terminal of each parasitic element to a proper node while referring to the node information 8b, and to store them as parasitic element information. The reference numeral 10b denotes the parasitic element information extracted by the parasitic element extracting means 9.

Figure 11:
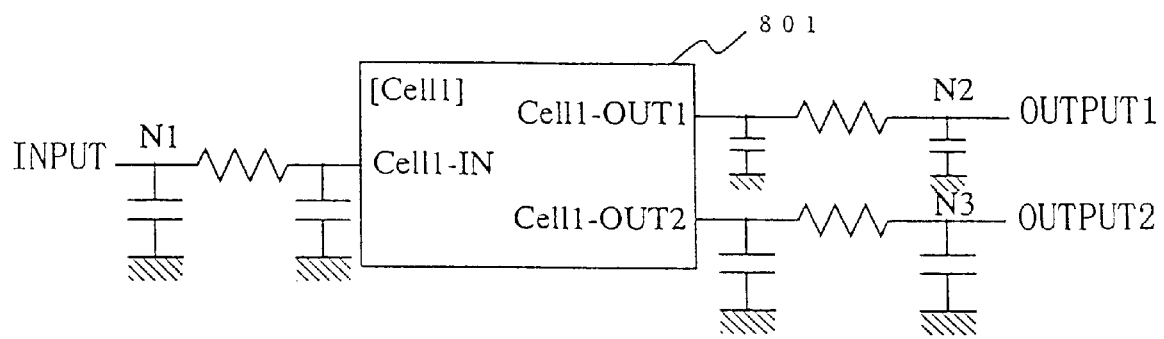
FIG. 11 is a diagram showing a circuit equivalent to a netlist obtained by the layout parameter extraction device.

The reference numeral 11 denotes a circuit output means for synthesizing the circuit information 6b and the parasitic element information 10b to form a circuit, and for outputting a result of formation as a netlist. The reference numeral 12b denotes the netlist output from the circuit output means 11. FIG. 11 is a diagram showing a circuit equivalent to the output netlist 12b.

In the present embodiment, accordingly, in the case where the parasitic elements are extracted for a circuit of only the upper hierarchy by the upper hierarchy recognizing means 13, the nodes "Cell1-IN", "Cell1-OUT1" and "Cell1-OUT2" which can uniquely be recognized are generated on the connecting points between the upper hierarchy and the lower hierarchy by the node generating means 7b and the node name assigning means 7c. These nodes are included in the netlist 12b output from the circuit output means 11. Consequently, if these nodes are specified as probing points for simulation, a partial circuit from an output pin of a predetermined cell to an input pin of another cell can easily be simulated.

(Third Embodiment)

Figure 12:
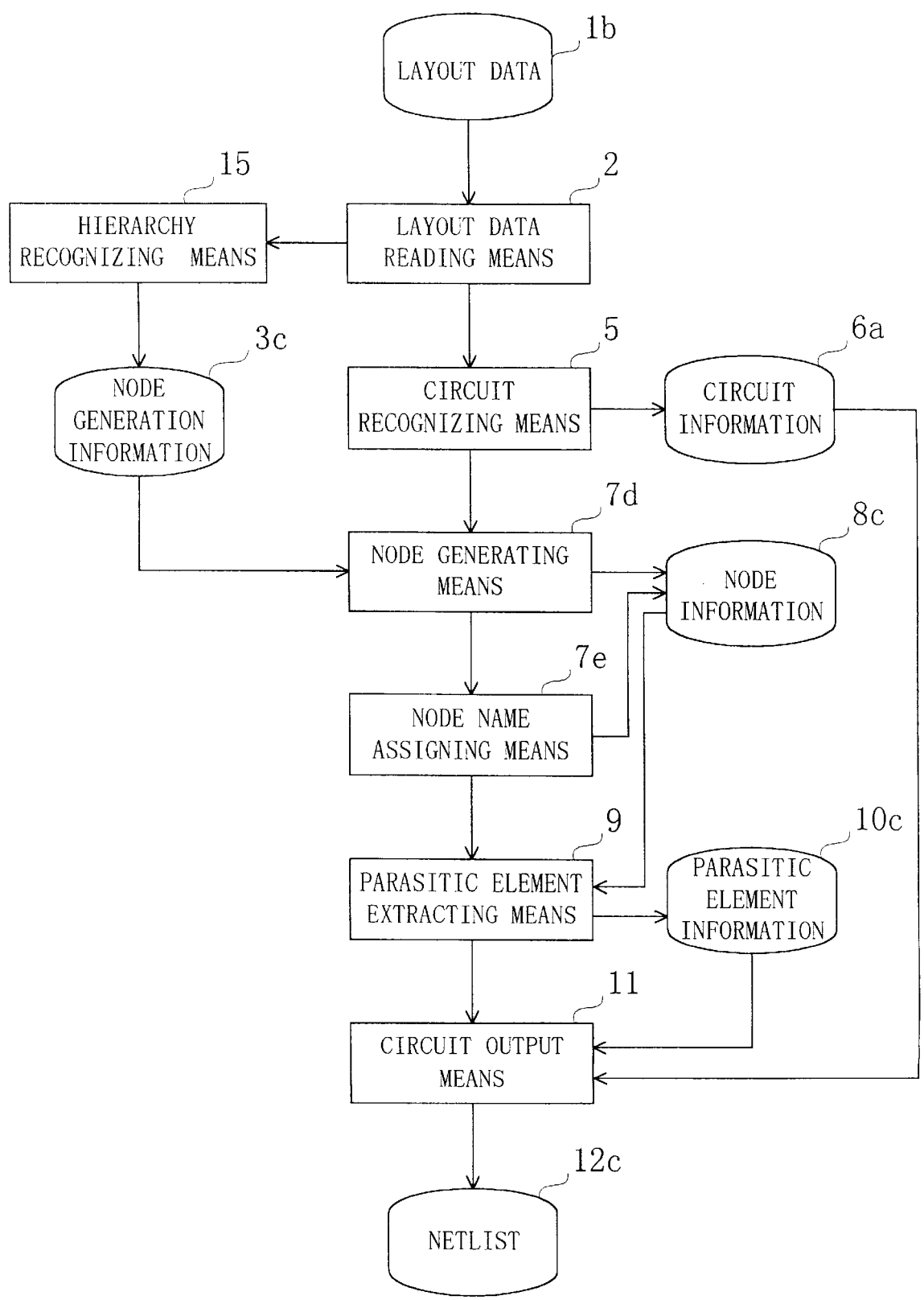
FIG. 12 is a block diagram showing a structure of a layout parameter extraction device according to a third embodiment of the present invention.

FIG. 12 shows a flow of a processing of a layout parameter extraction device according to a third embodiment of the present invention.

In FIG. 12, the reference numeral 1b denotes layout data having a hierarchical structure which has been used in the second embodiment shown in FIG. 7, for example. The reference numeral 2 denotes layout data reading means for reading the layout data 1b.

The reference numeral 15 denotes hierarchy recognizing means for recognizing an input pin "IN" and output pins "OUT1" and "OUT2" of a cell "Cell" which act as connecting points between an upper hierarchy and a lower hierarchy, and for storing them as node generation information. The reference numeral 3c denotes node generation information recognized by the hierarchy recognizing means 15 and used for generating nodes between the upper hierarchy and the lower hierarchy.

The reference numeral 5 denotes circuit recognizing means for recognizing a source, a drain and a gate of a transistor, an interconnect, a well, a contact and the like from the layout data 1b, and for storing transistor information and interconnect information as circuit information 6a. FIG. 4 is a diagram showing a circuit equivalent to the circuit information 6a.

The reference numeral 7d denotes node generating means for dividing and splitting an interconnect included in the circuit recognized by the circuit recognizing means 5 into a plurality of portions in the same manner as in the first embodiment, for setting dividing and splitting points to nodes, and for assigning node names to generate nodes. "N1", "N2", "N3", "N4" and "N5" shown in FIG. 13 denote the node names thus assigned. Furthermore, the node generating means 7d serves to read the node generation information 3c and to generate nodes on connecting points "IN", "OUT1" and "OUT2" between the upper hierarchy and the lower hierarchy. The generated nodes are stored as node information 8c.

Figure 13:
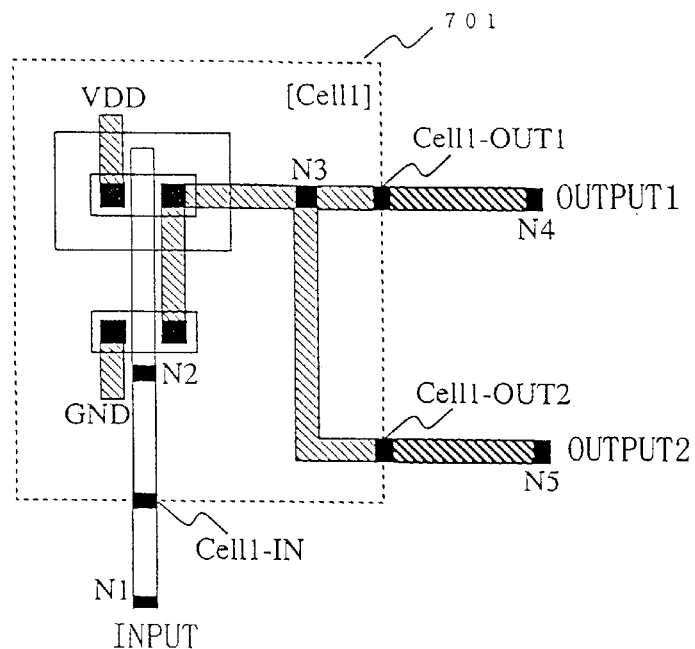
FIG. 13 is a diagram showing layout data obtained by adding nodes based on node generation information to the layout data to be used for the layout parameter extraction device.

The reference numeral 7e denotes node name assigning means for assigning node names to nodes generated on the connecting points "IN", "OUT1" and "OUT2" between the upper hierarchy and the lower hierarchy by the node generating means 7d. This assignment is performed in such a manner that the connecting points can uniquely be identified according to the processing shown in FIG. 10 in the same manner as in the second embodiment. "Cell1–IN", "Cell1–OUT1" and "Cell1–OUT2" are assigned as the node names of the nodes generated on the three connecting points. These node names are added to the node information 8c. FIG. 13 shows layout data including the generated nodes and the node names.

The reference numeral 9 denotes the same parasitic element extracting means as in the second embodiment. The parasitic element extracting means 9 serves to extract parasitic elements for each divided or split interconnect, to connect terminals of the parasitic elements to proper nodes on the basis of the node information 8c, and to store them as parasitic element information 10c.

Figure 14:
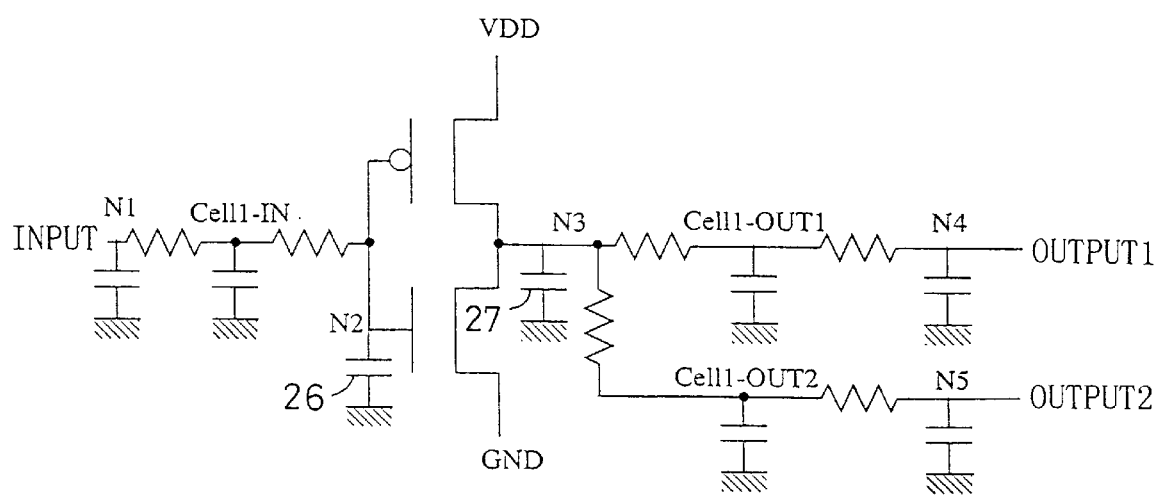
FIG. 14 is a diagram showing a circuit equivalent to a netlist obtained by the layout parameter extraction device.

The reference numeral 11 denotes a circuit output means for synthesizing the circuit information 6a and the parasitic element information 10c to form a circuit, and for outputting a result of formation as a netlist 12c. FIG. 14 is a diagram showing a circuit equivalent to the output netlist 12c.

In the present embodiment, accordingly, the input pin "IN" and output pins "OUT1" and "OUT2" between the cell "Cell" which act as the connecting points between the upper hierarchy and the lower hierarchy are obtained as the node generation information 3c by the hierarchy recognizing means 15, and the nodes "Cell1–IN", "Cell1–OUT1" and "Cell1–OUT2" which can uniquely be identified are generated on these positions and are included in the netlist 12c in FIG. 14 which is output from the circuit output means 11. In the layout data in FIG. 13, the positions of the nodes "Cell1–IN", "Cell1–OUT1" and "Cell1–OUT2" generated on the connecting points between the upper hierarchy and the lower hierarchy have the same node names as in the netlist 12c shown in FIG. 14. Accordingly, the input pin "IN" and output pins "OUT1" and "OUT2" of the cell on the layout data 1b can easily be specified on the basis of the netlist 12c, and can be used as probing points for simulation.

Figure 15:
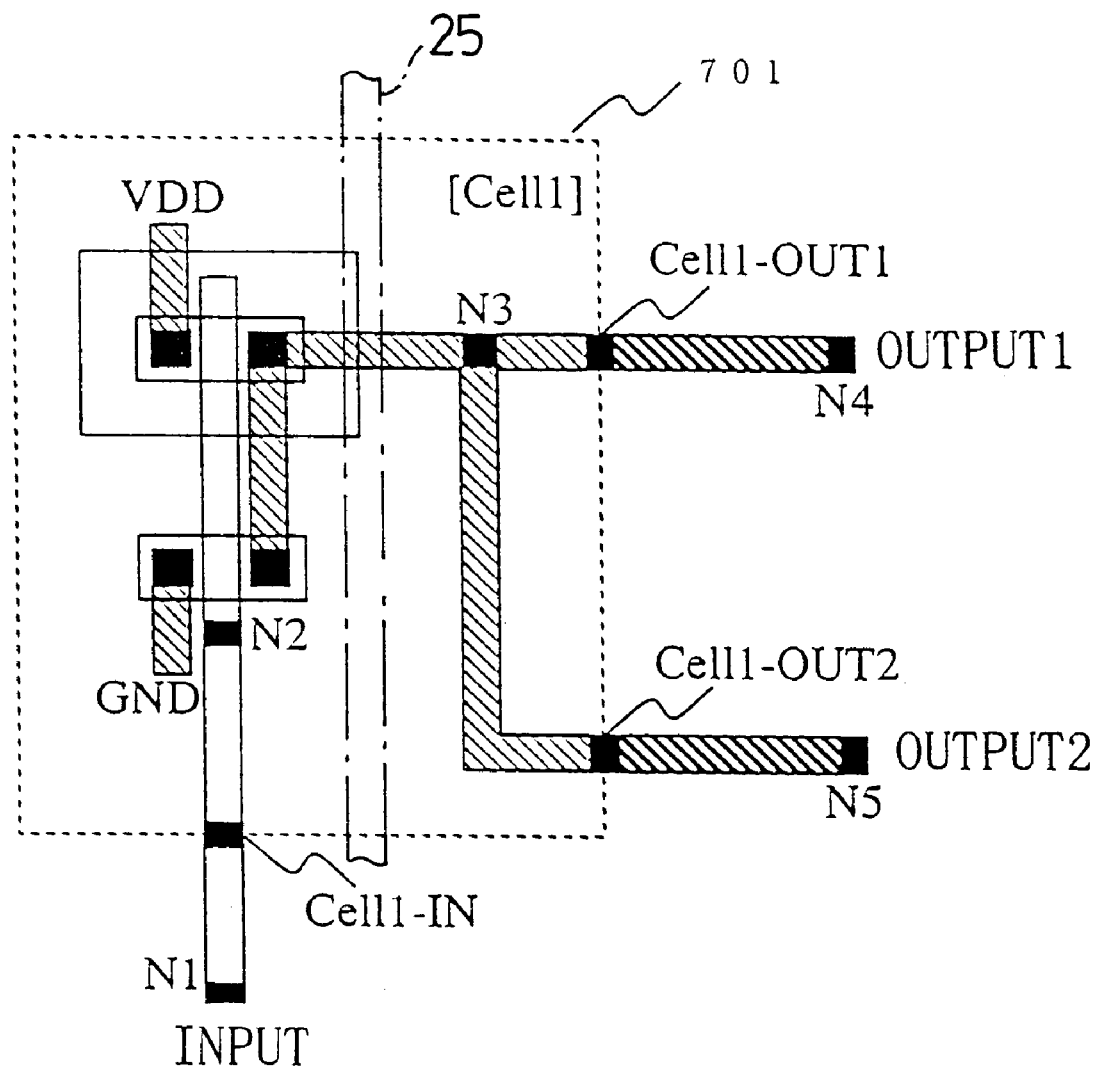
FIG. 15 is a diagram showing layout data illustrating the case where another interconnect exists in a position above a cell in an interconnect layer positioned on an interconnect layer on which the cell is provided.

As shown in FIG. 15, for example, in the case where another interconnect 25 is positioned on an interconnect layer positioned on the outer frame 701 of the cell, values of parasitic capacities (indicated at 26 and 27 shown in FIG. 14) connected to the nodes N2 and N3 in the cell "Cell1" shown in FIG. 13 are increased but simulation can be performed including the parasitic capacities having the values increased. As in the second embodiment, consequently, simulation precision can be enhanced more as compared with the case where the cell is recognized as the outer frame 801 and simulation is performed by using delay time information and consumed power which are characterized as a cell library.

(Fourth Embodiment)

A layout parameter extraction device according to a fourth embodiment of the present invention will be described below with reference to the drawings.

Figure 16:
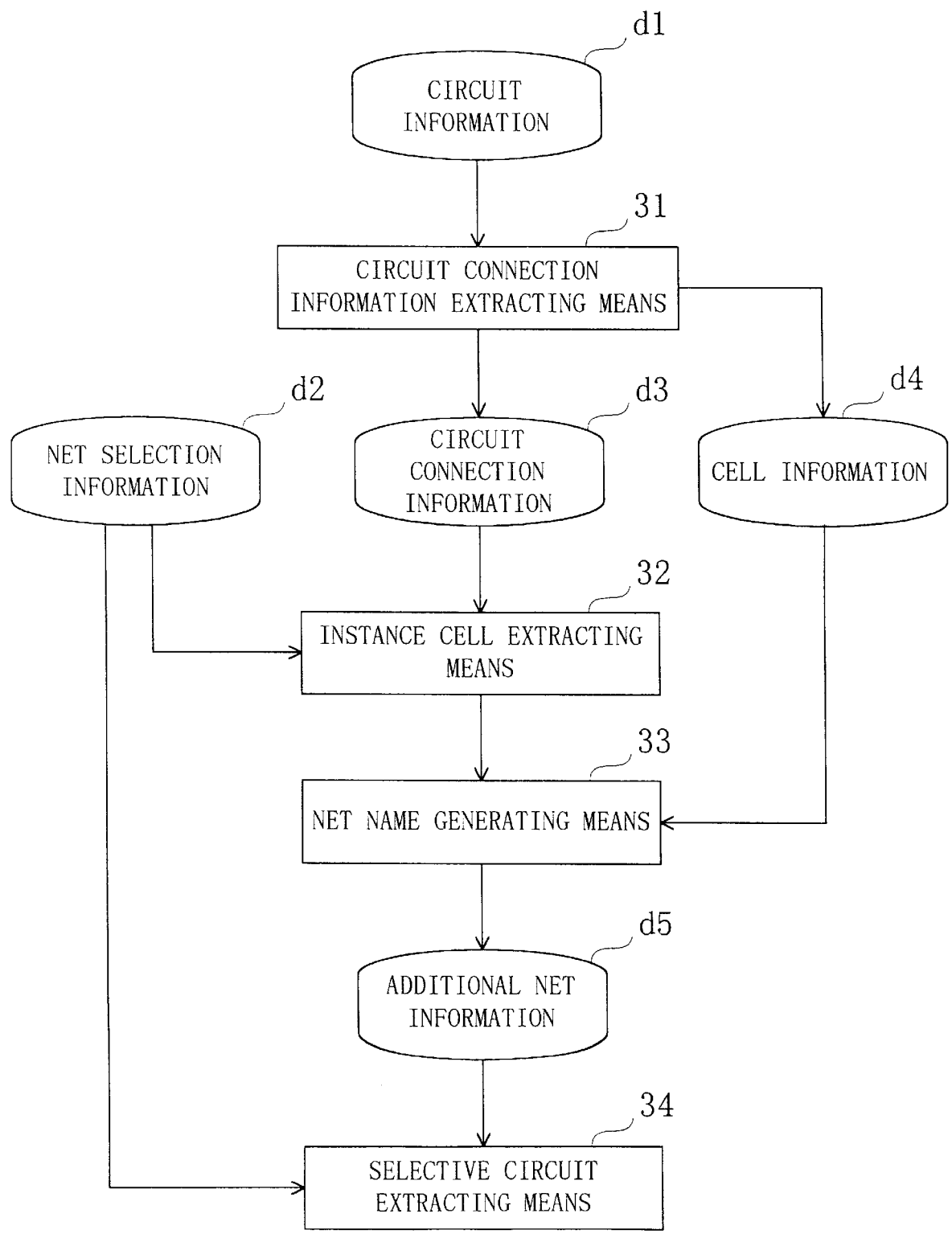
FIG. 16 is a diagram showing a flow of a processing of a layout parameter extraction device according to a fourth embodiment of the present invention.
Figure 17:
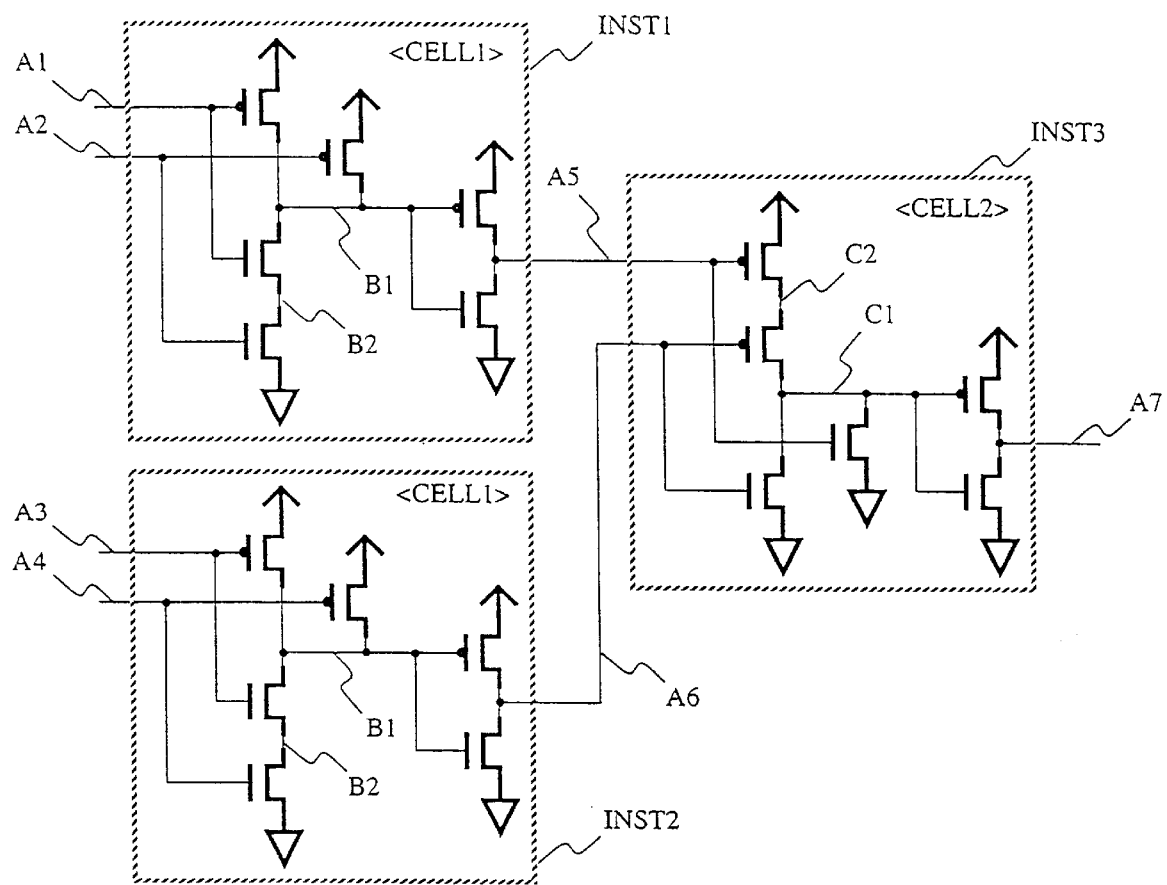
FIG. 17 is a diagram showing an example of circuit information to be used for the layout parameter extraction device.

FIG. 16 shows a flow of a processing of the layout parameter extraction device according to the fourth embodiment. In FIG. 16, the reference numeral d1 denotes circuit information shown in FIG. 17, for example. The circuit information shown in FIG. 17 has a hierarchical structure including an upper hierarchy on which nets A1 to A7 and three instance cells INST1, INST2 and INST3 referring to cells of a lower hierarchy are provided. The instance cells INST1 and INST2 are of the same kind. The lower hierarchy is formed by cells CELL1 and CELL2. The cell CELL1 has internal nets B1 and B2, and the other cell CELL2 has internal nets C1 and C2.

The reference numeral 31 denotes circuit connection information extracting means for reading the circuit information d1, extracting connection information between the nets A1 to A7 and the instance cells INST1 to INST3 of the upper hierarchy and storing the connection information as circuit connection information d3, and for extracting the internal nets B1 and B2 in the cell CELL1 of the lower hierarchy and the internal nets C1 and C2 in the cell CELL2 and storing them as cell information d4.

Figure 18:
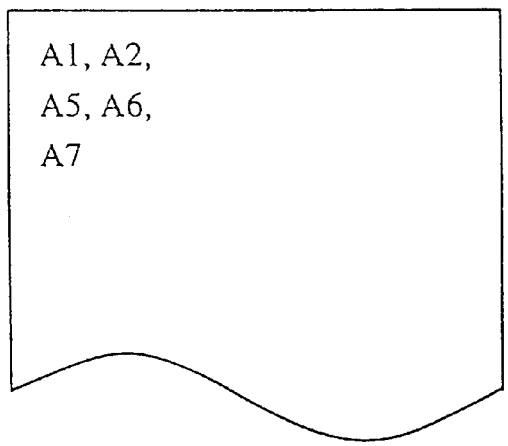
FIG. 18 is a diagram showing net selection information to be used for the layout parameter extraction device.

The reference numeral d2 denotes net selection information. For example, five nets A1, A2, A5, A6 and A7 of the upper hierarchy are specified as the net selection information d2 as shown in FIG. 18. FIG. 18 shows an example of the net selection information d2. In this example, the nets are specified in order to extract parasitic elements for a path from the nets A1 and A2 to the net A7 of the upper hierarchy.

The reference numeral 32 denotes instance cell extracting means for reading the circuit connection information d3 and the net selection information d2 and for extracting instance cells necessary for layout parameter extraction. More specifically, out of the instance cells INST1 to INST3, all the cell in which the connected nets are specified by the net selection information d2 are extracted. Since all the connected nets are selected in the instance cells INST1 and INST3, these instance cells INST1 and INST3 are extracted. The residual instance cell INST2 is not extracted because the nets A3 and A4 are not selected.

Figure 19:
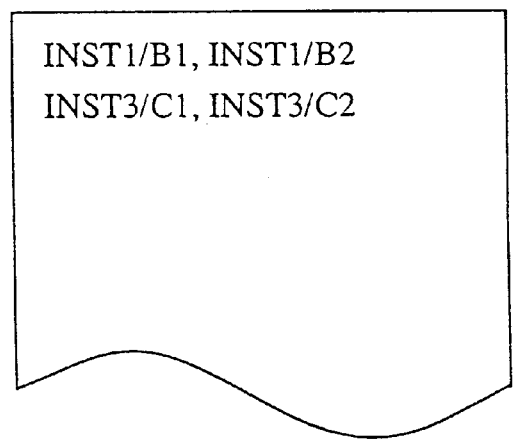
FIG. 19 is a diagram showing additional net information obtained by the layout parameter extraction device.

The reference numeral 33 denotes net name generating means. The net name generating means 33 extracts, from the cell information d4, internal nets included in the instance cells INST1 and INST3 extracted by the instance cell extracting means 32. More specifically, the net name generating means 33 recognizes that the internal nets B1 and B2 exist in the extracted instance cell INST1 and that the internal nets C1 and C2 exist in the extracted instance cell INST3 with reference to the cell information d4. Then, these internal nets are expanded into unique names of the whole circuit, that is, "INST1/B1", "INST1/B2", "INST3/C1" and "INST3/C2". These names are stored in additional net information d5. FIG. 19 shows the contents of the additional net information d5.

The reference numeral 34 denotes selective circuit extracting means for reading the net selection information d2 and the additional net information d5, adding the net information necessary for the lower hierarchy, that is, the internal cells "INST1/B1", "INST1/B2", "INST3/C1" and "INST3/C2" of the instance cells INST1 and INST3 to the nets A1, A2, A5, A6 and A7 of the specified upper hierarchy, and extracting parasitic elements from these nets.

In the present embodiment, accordingly, the instance cell extracting means 32 and the net name generating means 33 are provided to specify the nets of the upper hierarchy, so that the internal nets of the lower hierarchy necessary for extracting the parasitic elements are automatically generated. Consequently, the number of nets to be specified in advance can be decreased when extracting the parasitic elements. In addition, it is not necessary to grasp the net information of the lower hierarchy. Therefore, necessary nets can be selected simply and easily when extracting the parasitic elements.

I claim:

1. A layout parameter extraction device, comprising:
   layout data reading means for reading layout data;
   node generation information adding means for inputting
      node generation information including coordinates of nodes to be generated and node names capable of uniquely identifying the nodes, and for adding information for node generation to the layout data on the basis of the node generation information;

circuit recognizing means, which receives the layout data to which the information for node generation is added, for recognizing a circuit represented by the layout data and storing a result of recognition as circuit information;

node generating means, which receive the circuit information, for generating nodes on predetermined points of the circuit indicated by the circuit information on the basis of a shape of the circuit and generating nodes respectively on the coordinates on the basis of the information for node generation included in the received circuit information, for assigning node names capable of uniquely identifying nodes as names of the nodes generated on the coordinates, respectively, and for storing the nodes as node information;

parasitic element extracting means for extracting parasitic elements from the layout data, connecting the extracted parasitic elements to the nodes on the basis of the node information, and for storing them as parasitic element information; and circuit output means for forming a circuit from the circuit information and the parasitic element information, and outputting a netlist of a result of formation.

2. A layout parameter extraction device, comprising:

layout data reading means for reading layout data having a hierarchical structure including an upper hierarchy and a lower hierarchy;

upper hierarchy recognizing means for recognizing connecting points between the upper hierarchy and the lower hierarchy of the layout data, and for storing, as upper hierarchical data, the layout data of the upper hierarchy and placement information of the lower hierarchy;

circuit recognizing means for recognizing a circuit represented by the upper hierarchical data, and for storing the circuit as circuit information;

node generating means, which receives the circuit information, for generating nodes respectively on predetermined points of the circuit indicated by the circuit information on the basis of a shape of the circuit and generating nodes respectively on the connecting points between the upper hierarchy and the lower hierarchy recognized by the upper hierarchy recognizing means, and for storing the nodes as node information;

node name assigning means for assigning node names capable of uniquely recognizing nodes to the nodes generated on the connecting points between the upper hierarchy and the lower hierarchy, and for adding the node names to the node information;

parasitic element extracting means for extracting parasitic elements from the upper hierarchical data, for connecting the extracted parasitic elements to the nodes on the basis of the node information, and for storing them as parasitic element information; and circuit output means for forming a circuit from the circuit information and the parasitic element information, and for outputting a netlist of a result of formation.

3. A layout parameter extraction device, comprising:

layout data reading means for reading layout data having a hierarchical structure including an upper hierarchy and a lower hierarchy;

hierarchy recognizing means, which receives the layout data from the layout data reading means, for recognizing connecting points between the upper hierarchy and the lower hierarchy on the layout data, and for storing the connecting points as node generation information;

circuit recognizing means, which receives the layout data from the layout data reading means, for recognizing a circuit represented by the layout data, and for storing a result of recognition as circuit information;

node generating means, which receive the circuit information and the node generation information, for generating nodes respectively on predetermined points of the circuit indicated by the circuit information on the basis of a shape of the circuit and generating nodes respectively on the connecting points between the upper hierarchy and the lower hierarchy acting as the node generation information, and for storing the nodes as node information;

node name assigning means for assigning node names to the nodes respectively generated on the connecting points between the upper hierarchy and the lower hierarchy so as to be uniquely recognized, and for adding the node names to the node information;

parasitic element extracting means for extracting parasitic elements from the layout data, for connecting the extracted parasitic elements to the nodes on the basis of the node information, and for storing them as parasitic element information; and circuit output means for forming a circuit from the circuit information and the parasitic element information, and for outputting a netlist of a result of formation.

4. A layout parameter extraction device, comprising:

circuit connection information extracting means for inputting circuit information having a hierarchical structure including an upper hierarchy and a lower hierarchy, for recognizing connection state of a circuit from the circuit information, for extracting circuit connection information of a plurality of instance cells included in the upper hierarchy and interconnects between the instance cells, and for extracting internal nets as the lower hierarchy in each of the instance cells, and storing the internal nets as cell information;

instance cell extracting means, which receives net selection information including nets of the upper hierarchy which are selected in advance, for extracting an instance cell necessary for circuit extraction from the circuit connection information on the basis of the net selection information;

net name generating means for recognizing the internal nets in the instance cell extracted by the instance cell extracting means, for converting names of the recognized internal nets into net names capable of uniquely identifying nodes, and for storing the net names as additional net information; and selective circuit extracting means for adding the additional net information to the net selection information, for selecting a partial circuit including the nets, and for extracting parasitic elements for the partial circuit.

* * * * *

UNITED STATES PATENT AND TRADEMARK OFFICE
CERTIFICATE OF CORRECTION

PATENT NO. : 6,028,991
DATED : February 22, 2000
INVENTOR(S) : Teruo Akashi

It is certified that error appears in the above-identified patent and that said Letters Patent is hereby corrected as shown below:

<u>Title page,</u>
Please insert the following:
-- [30], Foreign Application Priority Data
April 26, 1996 [JP] Japanese Patent Application No. 8-106703 --.

Signed and Sealed this

Fourth Day of September, 2001

Attest:

*Nicholas P. Godici*

NICHOLAS P. GODICI
*Attesting Officer*    *Acting Director of the United States Patent and Trademark Office*